(12) United States Patent
Kribus et al.

(10) Patent No.: US 8,104,465 B2
(45) Date of Patent: Jan. 31, 2012

(54) SMALL-SCALE, CONCENTRATING, SOLAR CHP SYSTEM

(75) Inventors: Abraham Kribus, Rechovot (IL); Nathan-Arie Levy, RaAnana (IL); Daniel Kaftori, Alonei Abba (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 1115 days.

(21) Appl. No.: 10/556,341

(22) PCT Filed: May 12, 2004

(86) PCT No.: PCT/IL2004/000406
§ 371 (c)(1), (2), (4) Date: Apr. 17, 2007

(87) PCT Pub. No.: WO2004/099682
PCT Pub. Date: Nov. 18, 2004

(65) Prior Publication Data
US 2009/0194145 A1    Aug. 6, 2009

(30) Foreign Application Priority Data

May 12, 2003   (IL) .......................................... 155867

(51) Int. Cl.
*F24J 2/38* (2006.01)
(52) U.S. Cl. ..... 126/569; 126/573; 136/246; 250/203.4; 250/239
(58) Field of Classification Search .................. 126/569, 126/425, 600, 573; 136/246, 250; 250/203.4, 250/239
See application file for complete search history.

(56) References Cited

U.S. PATENT DOCUMENTS

| | | | |
|---|---|---|---|
| 3,427,093 A * | 2/1969 | Maples et al. | 359/236 |
| 4,192,583 A | 3/1980 | Horton | |
| 4,217,881 A * | 8/1980 | Brent | 126/603 |

(Continued)

FOREIGN PATENT DOCUMENTS
WO    WO 9713104 A1 *  4/1997

(Continued)

OTHER PUBLICATIONS

Examination Report Dated Dec. 12, 2006 From the Government of India, Patent Office Re.: Application No. 3355/CHENP/2005.

(Continued)

*Primary Examiner* — Stephen M. Gravini

(57) ABSTRACT

A high-efficiency, small-scale, combined heat and power, concentrating solar energy system (200), designed specifically for residential and other relatively low-power applications, rendering it cost-effective and economically viable. Two-axis tracking of a dish-like reflector (10) of between 1 and 2 meters in aperture ensures very high concentrating ratios of between 200 and 8-suns or even higher. In consequence very high coolant outlet temperatures, of 120-180° C. may be reached at the outlet of the collector coolant, which may be oil, gas, or pressurized water. The high coolant temperatures are advantageous because they may be used for air-conditioning. The high concentration is advantageous because the efficiency of the photo_voltaic cells is improved with higher concentration. The overall efficiency is greater than 60%. Additionally, a simple but accurate drive, designed as a radio-dial drive (14), with substantially zero backlash, and substantially zero drive, is provided for driving the concentrating solar energy system. Preferably, two radio-dial drives are employed and tracking is performed along two axes, of an azimuth-elevation mount, a polar mount, or a cross mount.

38 Claims, 10 Drawing Sheets

U.S. PATENT DOCUMENTS

| | | | | | |
|---|---|---|---|---|---|
| 4,229,941 | A | * | 10/1980 | Hope | 60/641.15 |
| 4,249,514 | A | * | 2/1981 | Jones | 126/605 |
| 4,276,122 | A | * | 6/1981 | Snyder | 202/234 |
| 4,289,112 | A | * | 9/1981 | Roseen | 126/568 |
| 4,307,711 | A | * | 12/1981 | Doundoulakis | 126/677 |
| 4,314,546 | A | * | 2/1982 | Miller | 126/578 |
| 4,325,788 | A | * | 4/1982 | Snyder | 202/234 |
| 4,340,031 | A | * | 7/1982 | Niedermeyer | 126/600 |
| 4,367,403 | A | * | 1/1983 | Miller | 250/203.4 |
| 4,404,465 | A | * | 9/1983 | Miller | 250/203.4 |
| 4,427,838 | A | * | 1/1984 | Goldman | 136/248 |
| 4,440,150 | A | | 4/1984 | Kaehler | |
| 4,442,348 | A | * | 4/1984 | Snyder | 250/203.4 |
| 4,508,426 | A | * | 4/1985 | Hutchison | 359/852 |
| 5,148,012 | A | | 9/1992 | Carter | |
| 5,934,271 | A | * | 8/1999 | Kaneff | 126/600 |
| 6,067,982 | A | * | 5/2000 | Harrison | 126/571 |
| 6,080,927 | A | | 6/2000 | Johnson | |
| 6,498,290 | B1 | | 12/2002 | Lawheed | |
| 6,650,357 | B1 | * | 11/2003 | Richardson | 348/80 |
| 6,953,038 | B1 | * | 10/2005 | Nohrig | 126/694 |
| 6,961,080 | B2 | * | 11/2005 | Richardson | 348/80 |
| 6,996,983 | B2 | * | 2/2006 | Cameron | 60/517 |
| 7,277,223 | B2 | * | 10/2007 | Baun et al. | 359/399 |
| 2003/0051750 | A1 | | 3/2003 | Lawheed | |
| 2004/0114219 | A1 | * | 6/2004 | Richardson | 359/368 |
| 2005/0000213 | A1 | * | 1/2005 | Cameron | 60/517 |
| 2006/0050146 | A1 | * | 3/2006 | Richardson | 348/80 |
| 2006/0132908 | A1 | * | 6/2006 | Baun et al. | 359/366 |
| 2007/0070531 | A1 | * | 3/2007 | Lu | 359/851 |
| 2007/0240705 | A1 | * | 10/2007 | Papadopoulos | 126/690 |
| 2007/0246095 | A1 | * | 10/2007 | Schaefer | 136/246 |
| 2008/0264486 | A1 | * | 10/2008 | Chen et al. | 136/259 |
| 2008/0314437 | A1 | * | 12/2008 | Regev | 136/246 |
| 2009/0194145 | A1 | * | 8/2009 | Kribus et al. | 136/248 |
| 2010/0006088 | A1 | * | 1/2010 | Campbell et al. | 126/573 |
| 2010/0078062 | A1 | * | 4/2010 | Wang et al. | 136/246 |

FOREIGN PATENT DOCUMENTS

| | | |
|---|---|---|
| WO | WO 02/084747 | 10/2002 |
| WO | WO 2004088759 A2 * | 10/2004 |
| WO | WO 2004/099682 | 11/2004 |
| WO | WO 2004099682 A2 * | 11/2004 |

OTHER PUBLICATIONS

Observation by Third Party Pursuant to Article 115 EPC Dated Aug. 26, 2007 From the European Patent Office Re.: Application No. 04732400.9.

Translation of the Office Action Dated May 30, 2008 From the Patent Office of the People's Republic of China Re.: Application No. 200480020067.6.

Office Action Dated Dec. 18, 2009 From the State Intellectual Property Office of the People's Republic of China Re.: Application No. 200480020067.6 and Its Translation Into English.

Response Dated Nov. 30, 2009 to Official Action of Sep. 30, 2009 From the US Patent and Trademark Office Re.: U.S. Appl. No. 11/556,341.

Translation of the Office Action Dated Nov. 7, 2008 From the Patent Office of the People's Republic of China Re.: Application No. 200480020067.6.

Office Action Dated Sep. 25, 2008 From the Israeli Patent Office Re.: Application No. 155867.

Office Action Dated Jun. 19, 2009 From the State Intellectual Property Office of the People's Republic of China Re.: Application No. 200480020067.6 and Its Translation Into English.

Official Action Dated Jan. 20, 2010 From the US Patent and Trademark Office Re.: U.S. Appl. No. 10/556,341.

Response Dated Feb. 18, 2010 to Office Action of Dec. 18, 2009 From the State Intellectual Property Office of the People's Republic of China Re.: Application No. 200480020067.6.

ABC Radio "Concentrated Solar Power on Tap", ABC Radio National: The Buzz Jul. 30, 2001, An ABC Radio Interview With Joe Coventry, A Ph.D Student at Australian National University in Canberra (ANU), 2 P. 2001. Published in ABC Website: http://www.abc.net.au/science/buzz/stories/s337606.htm.

Thoroughgood "Best Solar Project: Household Concentrated Photovoltaic Energy System", Post-Graduate Students' Energy Awards Nov. 2002, Australian Institute of Energy, 10 P., 2002. Abstract of Post-Graduated Student Dennis Thoroughgood. http://www.aie.org.au/melb/aug02/htm.

Office Action Dated Aug. 18, 2010 From the Israel Patent Office Re. Application No. 171863 and Its Translation Into English.

* cited by examiner

SMALL-SCALE, CONCENTRATING, SOLAR CHP SYSTEM

RELATED APPLICATIONS

This application is a National Phase Application of PCT Application No. PCT/IL2004/000406 having International Filing Date of May 12, 2004, which claims the benefit of Israel Patent Application No. 155867, filed on May 12, 2003. The contents of the above Applications are all incorporated herein by reference.

FIELD AND BACKGROUND OF THE INVENTION

The present invention relates to high-efficiency, small-scale, combined heat and power (CHP), concentrating solar energy systems, and to a radio-dial drive, for celestial tracking mechanisms, which may be used with the concentrating solar energy systems.

Solar photovoltaic collectors are usually of the flat plate type, consisting of a large area of stationary photovoltaic cells that receive natural sunlight, but do not follow the apparent motion of the sun. As yet, power generation by these photovoltaic collectors is not economic, when compared with conventional power sources of fossil fuels.

One approach to reducing the cost of power generation by solar photovoltaic collectors is to concentrate the sunlight by optical means, such as lenses and (or) mirrors, thus reducing the actual area of the photovoltaic cells, per kW. Current cells can be activated by solar radiation, which is concentrated by a factor of up to 1,000; therefore the required photovoltaic cell area per kW is 1,000 times less. The resultant power system may be more cost-effective, even when taking into account the more expensive photovoltaic cells for the concentrated radiation and the additional components of the concentrating system, such as, the focusing optics, the mechanical support structure, the tracking mechanism, and the computer control for the tracking.

Large concentrating solar power systems, operating with photovoltaic cells, have been proposed and built. These may include a single, large concentrator, or a cluster of large concentrators. Yet, to be economically viable, a collector area of about 100 to 200 square meters is required, for each concentrator, so as to spread the cost of the additional components of the concentrating system, per kW. These large concentrating solar power systems are suitable for remote areas, which have no access to the grid.

Nonetheless, employing large concentrating solar power systems suffers from a number of drawbacks.

1. Although in general, a larger system tends to be more economical than a smaller system, there are disadvantages to a larger system, as well. Wind resistance is higher, creating high forces on the collector, and these may lead to structural deformation and may interfere with the accuracy of the tracking.

In consequence, the support structure and tracking mechanism must be massive and quite expensive.

2. With an efficiency of power conversion to photovoltaic cells in the range of 10 to about 37 percent, most of the solar energy is discharged as heat. Yet in a centralized, remote area there is little opportunity to utilize that heat, for example, in a Combined Power and Heat (CPH) system, thus the heat is wasted.

3. The large concentrating solar power systems are installed away from the consumer. Therefore additional costs due to power distribution and to transmission losses of about 10-20% of the power transmitted are incurred, raising the cost of the electric power thus produced by factors of between 2 and 3. Yet with large concentrating systems of photovoltaic cells, transmission and distribution costs cannot be avoided since the systems are too large to be installed at the points of consumption.

4. The initial investment for large concentrating solar power systems is very high, making decisions in this regard difficult, bureaucratic, and risky.

5. Furthermore, competitive costs may be realized for large concentrating solar power systems if a significant number of them, equivalent for example, to at least 50 megawatt per year, is manufactured. Yet such a market volume is difficult to guarantee; therefore, the investment and the risk associated with the development of such large systems are very high.

6. Large concentrating solar power systems must be installed by trained personnel with specialized equipment and facilities, requiring special contractors, and special licenses, which increase their costs.

7. Large concentrating solar power systems would generally require environmental studies and permits, so as to further increase their costs.

8. Centralized power plants in general are vulnerable to malfunction and sabotage. A single incident of this nature can disrupt power supply for a very large segment of the population.

Ali, A. M., et al. in "A simplified sun tracker for residential applications," EDB 86-16 86:126758 8607012784 NDN-168-0431-1885-2, 1986, CONF-860222, Pergamon Press, Elmsford, N.Y., USA, describes a sun tracker of low cost and a simple circuitry, that guarantees easy maintenance and operational procedures, making it suitable for domestic applications. The tracker has a shaft encoder, a 50 W motor developing 20 N-m and is provided with a brake, to produce a torque of up to 500 N-m, when the motor is off, together with an electronic control circuit. The system has been tested in conjunction with a domestic concentrator-type solar water heater, but it is believed that maximum benefit would be realized when used as a hybrid system, incorporating photovoltaic and hot water units.

However, the system of Ali, et al. has digital tracking, with a resolution of about 0.72 degrees, relies on polished aluminum troughs, as linear concentrators, and uses a single-axis tracking mechanism, so that overall, it achieves a concentrating factor of only about 10.

Additionally, the system of Ali, et al. uses both photovoltaic cells and hot water units. In practice, the hot water units are not necessary, since waste heat from the photovoltaic converter can be used for producing hot water. Additionally, Komp, R. J. in "Field experience and performance evaluation of a novel photovoltaic thermal hybrid solar energy collector," EDB, 86-15, 86:116025, 8606508853, NDN-68-0430-1210-7, 1985, CONF-850604, SESCI, Ottawa, Ontario, Canada, describes a new design of a hybrid solar module, capable of furnishing 150 watts (AM1 peak power) of electrical power and 1600 watts of thermal energy in the form of hot water. The module incorporates photovoltaic cells, encapsulated in silicone mounted on the front surface of extruded aluminum fins. Copper tubes forced into the backs of the fins carry the cooling fluid (usually water) to remove the heat while curved aluminum reflectors concentrate light onto the silicon solar cells. The linear curved concentrators (similar to those developed by Winston) require no tracking or seasonal adjustment at the low concentration ratio of 2.1 to 1. The module is intended for residences or small businesses that do not have ready access to conventional utilities. It is essentially a single-size unit and may be installed in a similar manner as a conventional solar heater, with a portion of the solar cell array dedicated to powering and controlling the circulating pump and, if necessary, a valve for a hot water system. The photovoltaic array is split into two separate sections that can be wired in parallel for 12V or in series for 24V systems.

Yet, the system of Komp relies on linear concentrators, does not use tracking, and achieves a concentration ratio of only about 2.1 to 1.

Furthermore, O'Neill, M. J., et al., in "Fabrication, installation, and two-year evaluation of a 245 square meter linear Fresnel lens photovoltaic and thermal (PVT) concentrator system" Dallas/Ft. Worth (DFW) Airport, Texas, DOE/ET/ 20626-T1, Final technical report, Phase II and Phase III EDB 85-10 85:066882 8505013921 NDN-168-0406-6186, 1985, summarizes the results of the fabrication, installation, and two-year evaluation of the first linear Fresnel lens photovoltaic and thermal (PVT) concentrator system ever deployed. The system is located on the Central Utility Plant at DFW Airport, Texas. The roof-mounted collector field provides 245 square meters of sun-tracking collector aperture area. The nominal 25 kilowatt peak electrical output of the system is used for plant lighting, while the nominal 120 kilowatt peak thermal output is used to preheat domestic water for the nearby AMFAC hotel. The system has performed efficiently and reliably over the full two-year operational period. Long-term system conversion efficiencies have been 7.7% sunlight-to-electricity, 39.1% sunlight-to-heat, 46.8% sunlight-to-total energy output. Each of these efficiency levels is thought to be the highest ever achieved by a commercial-scale photovoltaic system. System durability has also been excellent, with no detectable degradation in performance over the full operational period. In summary, the successful application experiment has verified the potential of the linear Fresnel lens PVT system to reliably and efficiently deliver electricity and heat in commercial-scale applications.

However, the system of O'Neill, et al. is relatively large, producing 120 kilowatt peak thermal output and using 245 square meters of sun-tracking collector aperture area; therefore, it is not applicable to domestic and other small-scale or rooftop applications.

Moreover, Henry, E. M. et al., in "Mississippi County Community College solar photovoltaic total energy project," EDB 81-11 81:055203 8103063734 NDN-168-0268-2847-2, 1979, CONF-790541-(Vol. 3), Pergamon Press Inc., Elmsford, N.Y., describes a project, by which Mississippi County Community College at Blytheville, Ark., was to derive its electrical and thermal energy from an actively cooled photovoltaic system, developed under the management of TEAM, Inc. The 320 kW concentrator system (DOE standard conditions) was the world's largest photovoltaic demonstration, as of that date (1979). The single-axis tracking collectors were 7 foot by 20 foot parabolic troughs with a geometric concentration of 42. The solar cells were single crystal silicon, designed to match the physical and spectral parameters of the collector. The power conditioning system was utility interactive to provide not only for backup power, but for a power exchange between the solar energy system and the local utility. Process control included data acquisition on all system components and building demands, as well as required control of all components. Thermal energy from the solar cell coolant was provided to the college for winter heating and year-round domestic hot water. The energy system was expected to be operational in the winter of 1979, with connection to the college facilities in the summer of 1980.

However, again the system of Henry, et al. is relatively large, single-axis tracking system, adapted for producing 320 kW, and achieving a concentration factor of only about 42.

Yet there is still a widely recognized need for, and it would be highly advantageous to have, relatively small cost-effective solar power systems, which have a low production rate threshold for competitive mass production, can be installed close to the consumers of energy, and provide means to use the generated heat as well as the electricity.

SUMMARY OF THE INVENTION

The object of the present invention relates to providing a high-efficiency Combined Heat and Power (CHP) solar energy system, sufficiently compact to be installed at the point of consumption, with minimal investment in infrastructure, and amenable to mass production, leading to low production cost even with a relatively small market volume, so that overall, the cost of the energy which is consumed is competitive with conventional power generation from fossil fuels.

The present invention successfully addresses the shortcomings of the presently known configurations by providing a high-efficiency, small-scale, combined heat and power (CHP), concentrating solar energy system, designed specifically for residential and other relatively low-power applications, rendering it cost-effective and economically viable. Two-axis tracking of a dish-like reflector of between 1 and 2 meters in aperture ensures very high concentrating ratios of between 200 and 800 suns or even higher, if cells suitable for operation at higher concentration are available. In consequence very high coolant outlet temperatures, of 120-180° C. may be reached at the outlet of the collector coolant, which may be oil, gas, or pressurized water. The high coolant temperatures are advantageous because they may be used for air-conditioning or other applications requiring high temperatures. The higher concentration is advantageous because the efficiency of the photovoltaic cells designed for concentrated radiation is improved with higher concentration. The overall efficiency is greater than 60%. Additionally, a simple but accurate drive, designed as a radio-dial drive, with substantially zero backlash, and substantially zero drift, is provided for driving the concentrating solar energy system. Preferably, two radio-dial drives are employed and tracking is performed along two axes, of an azimuth-elevation mount, a polar mount, or a cross mount.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

Figure 1A:
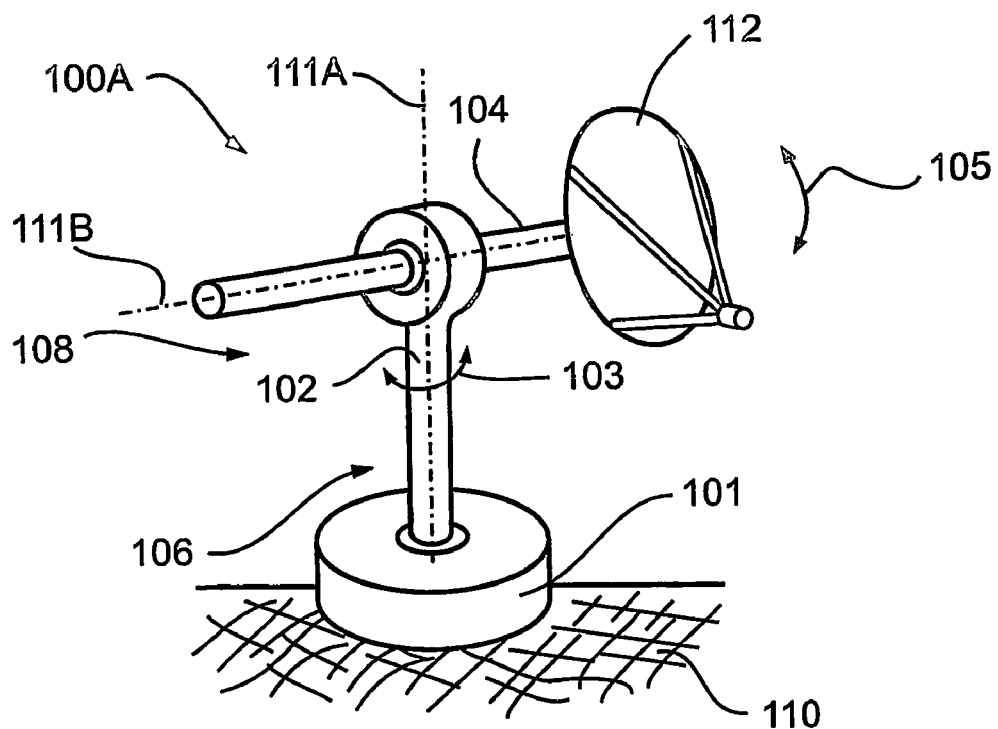
FIGS. 1A-1C schematically illustrate an azimuth-elevation mount, a cross-over mount and a polar mount as known.

The present invention is a high-efficiency, small-scale, combined heat and power, concentrating solar energy system, designed specifically for residential and other relatively low-power applications, rendering it cost-effective and economically viable. Two-axis tracking of a dish-like reflector of between 1 and 2 meters in aperture ensures very high concentrating ratios of between 200 and 800 suns or even higher. In consequence very high coolant outlet temperatures, of 120-180° C. may be reached at the outlet of the collector coolant, which may be oil, gas, or pressurized water. The high coolant temperatures are advantageous because they may be used for air-conditioning. The high concentration is advantageous because the efficiency of the photovoltaic cells is improved with higher concentration. The overall efficiency is greater than 60%. Additionally, a simple but accurate drive, designed as a radio-dial drive, with substantially zero backlash, and substantially zero drift, is provided for driving the concentrating solar energy system. Preferably, two radio-dial drives are employed and tracking is performed along two axes, of an azimuth-elevation mount, a polar mount, or a cross mount.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Figure 1B:
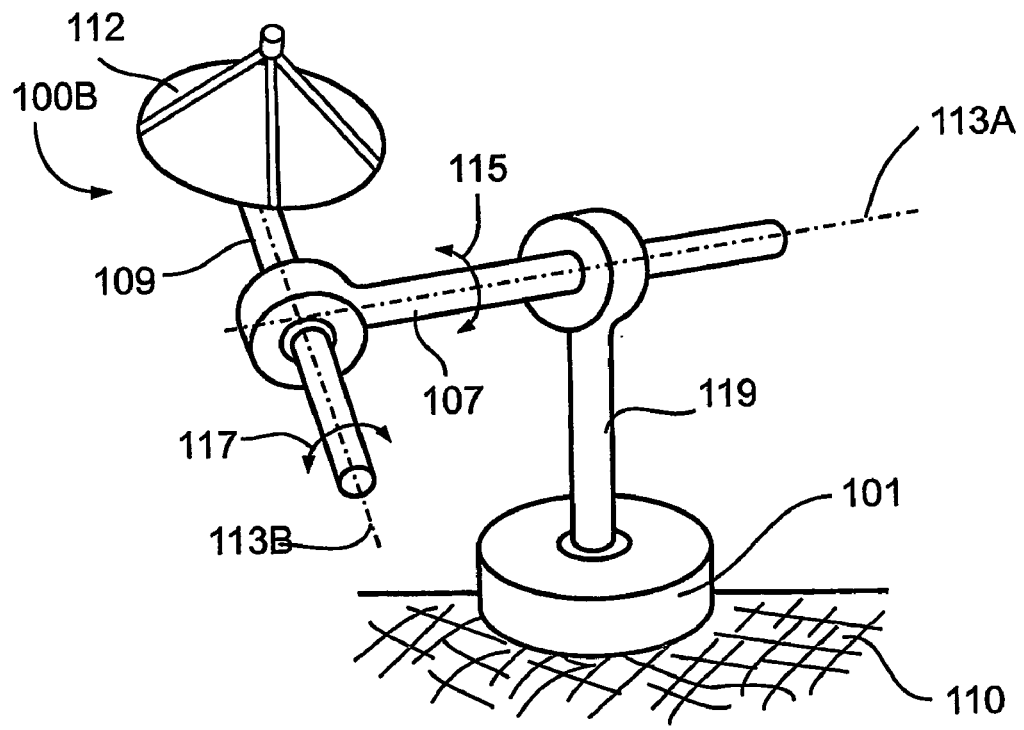
Figure 1C:
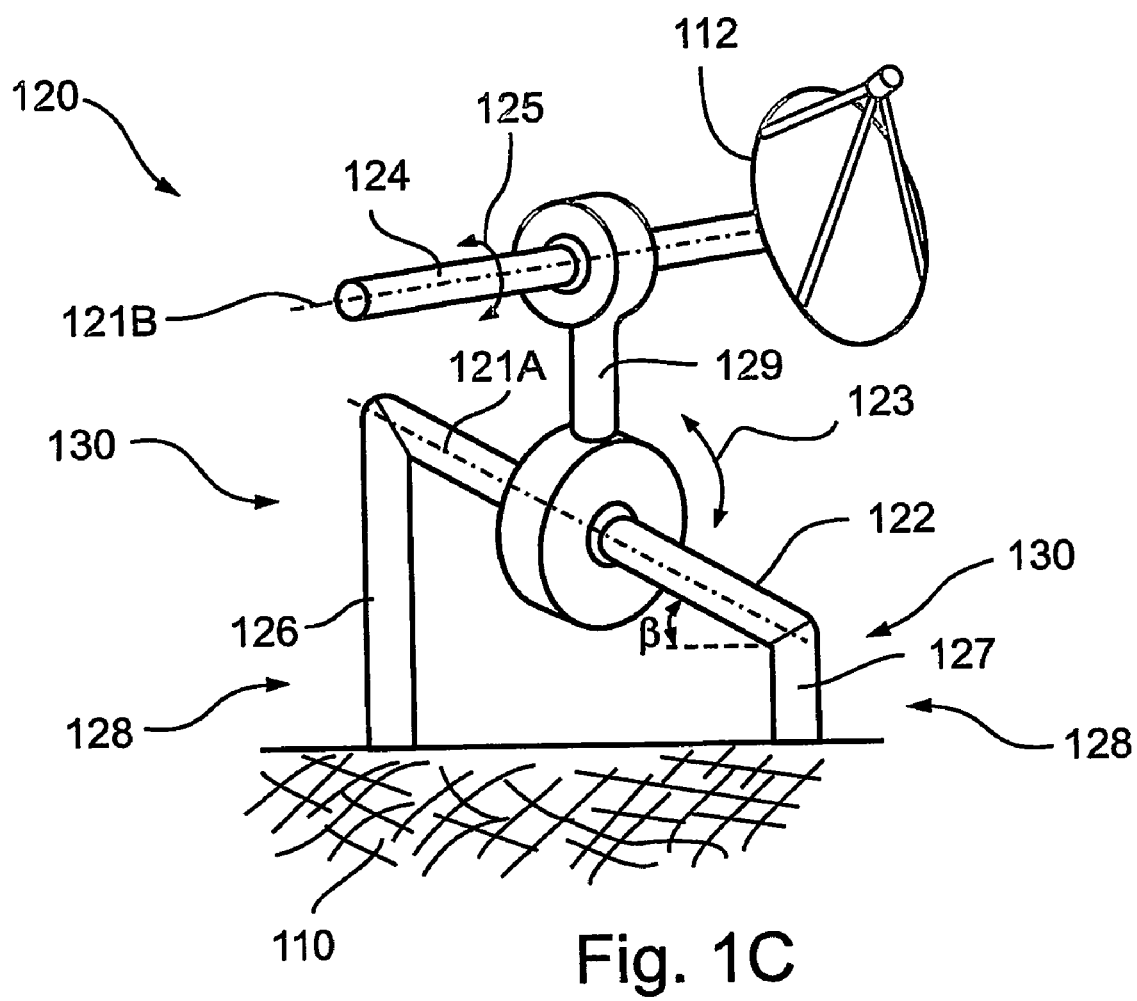

For purposes of better understanding the present invention, reference is first made to the construction and operation of conventional celestial tracking systems, illustrated in FIGS. 1A-1C.

FIG. 1A schematically illustrates an azimuth-elevation mount 100A, for celestial tracking, as known.

In essence, azimuth-elevation mount 100A includes two rotating shafts, an azimuth shaft 102, which rotates around an axis 111A, as shown by an arrow 103, and an elevation shaft 104, which rotates around an axis 111B, as shown by an arrow 105. Azimuth-elevation mount simultaneously tracks the sun with respect to geographic, seasonal and daily variations.

Azimuth shaft 102 is substantially vertical and has proximal and distal ends 106 and 108, with respect to a ground 110, wherein proximal end 106 is fixed to ground 110, in a support 101, which enables the rotation in the direction of arrow 103. Any device, mounted on azimuth shaft 102, will rotate so as to change its azimuth.

Elevation shaft 104 is horizontal and is mounted on azimuth shaft 102. Any device, mounted on elevation shaft 104, will rotate in the vertical plane, while maintaining a fixed azimuth.

A Device 112, such as a reflector 112, may be mounted on elevation shaft 104.

Thus, elevation shaft 104, which is mounted on azimuth shaft 102, will rotate so as to change its azimuth, while reflector 112, mounted on elevation shaft 104 will rotate in the vertical plane, and at the same time, change its azimuth.

Preferably, the rotations of azimuth shaft 102 and elevation shaft 104 are computer-controlled, based on an expression for the direction that will maximize the solar incident flux, as a function of geographic location, date, and hour. Additionally or alternatively, a closed-loop operation, based on measured solar incident flux may be employed.

Azimuth-elevation mount 100A is often used for heliostats and solar concentrators. Its advantage is that the mechanics are the same for all locations, so no physical adjustments need to be made, specifically for each geographic location. Its main disadvantage is that both axes are constantly moving, at variable speeds, so that together they correct for three effects, the geographic, the seasonal, and the hourly changes of the direction that will maximize the solar incident flux.

Azimuth-elevation mount 100A is considered an Euler system, and has a singularity when the sun is in the zenith, which may take place at latitudes of ±23.5°. Thus, it may be inappropriate near the equator.

FIG. 1B schematically illustrates a cross mount 100B, as known.

Cross mount 100B includes a vertical rod 119 which is fixed to ground 110. A horizontal rod 107, mounted on vertical rod 119 defines an axis of rotation 113A, as shown by an arrow 115. A rod 109, mounted on rod 107 defines an axis of rotation 113B, as shown by an arrow 117.

Reflector 112 is mounted on rod 109, so as to rotate with rods 107 and rod 109, changing its azimuth and elevation.

Cross mount 100B has singularity near the polar region.

FIG. 1C schematically illustrates a polar mount 120, as known.

In essence, polar mount 120 compensates for daily and seasonal variations of direction that will optimize the solar incident flux, while the geographic affect is built into the mount.

Polar mount 120 includes poles 126 and 127, both having proximal and distal ends 128 and 130, with respect to ground 110, wherein proximal ends 128 are fixed to ground 110. A rod 122, extending north to south between distal ends 130 of poles 126 and 127, makes an angle β with the face of the earth (ground 110), angle β being substantially equal to the geographical latitude. Rod 122 defines a length axis 121A, which is parallel to the axis of rotation of the earth, i.e., the line connecting the Earth's poles.

A second rod 129, mounted on rod 122 and adapted for rotation around axis 121A, as shown by an arrow 123, follows the daily motion of the sun, from east to west. Rotation around axis 121A is the daily rotation around the daily axis.

A third rod 124, mounted on rod 129, defines a second axis of rotation 121B, as shown by an arrow 125. Rotation around axis 121B is the seasonal rotation, in a plane that extends north-south and is inclined from the vertical by an amount determined by rod 122, i.e., angle β. Rod 124 is used to correct the solar tracking for the seasonal changes, i.e., the tilt of the sun's daily trajectory in the sky.

In consequence, the rotational motion of rod 124 is considerably slower than that of rod 129.

Polar mount 120 is less popular than azimuth-elevation mount 100A or cross mount 110B because the mechanical alignment for the polar mount is critical and is different for each geographic latitude. Yet, polar mount 120 is advantageous over the mounts 100A and 100B in that, when aligned correctly, the required motion is much simpler. For one thing, rod 124, rotating around axis 121B, requires infrequent corrections, for example, once or twice per day. For another, rod 129, rotating around axis 121A, rotates at a constant speed.

An aspect of the present invention relates to a cost-effective, accurate solar tracking system, which may be used any of the mounts of FIGS. 1A-1C, or any other two-axis mount, and reduce considerably the cost of accurate solar and other celestial tracking, making small-scale solar power generation economically viable.

Figure 2A:
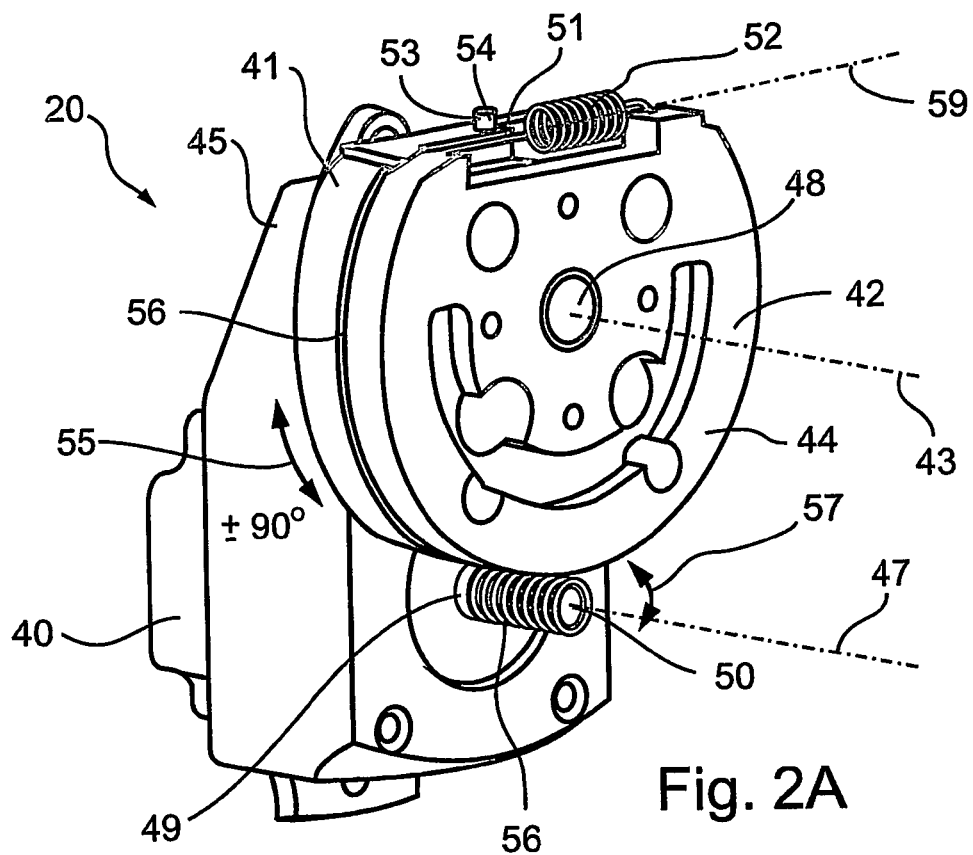
FIGS. 2A-2B schematically illustrate first and second views of a radio-dial drive, in accordance with the present invention.
Figure 2B:
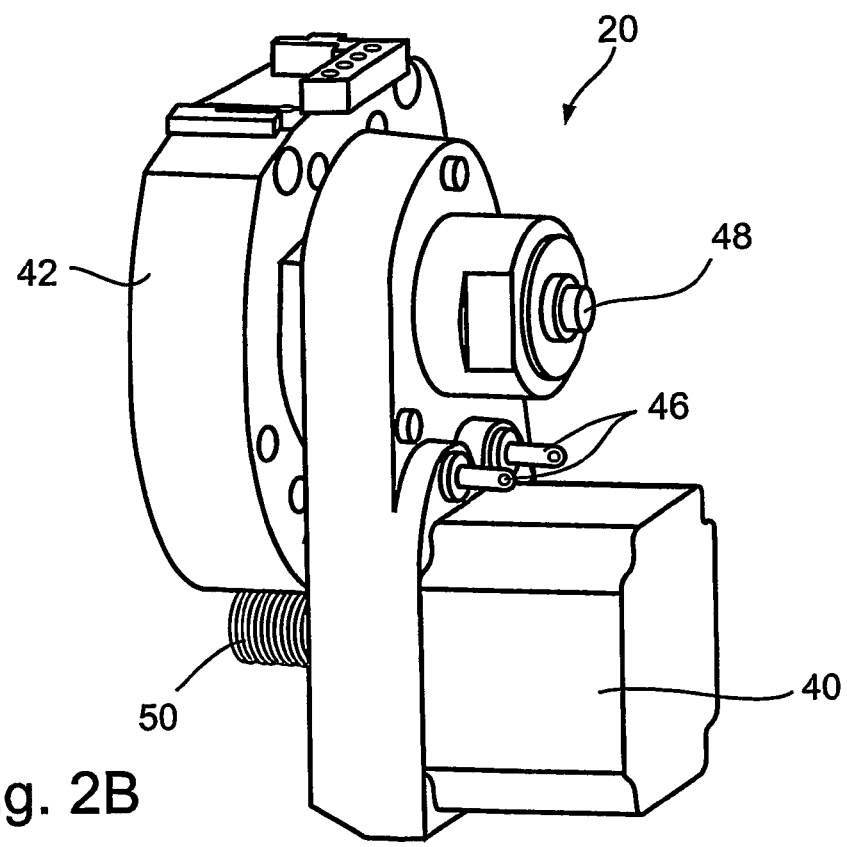

Thus, FIGS. 2A-2B schematically illustrate first and second views a radio-dial drive 20, for celestial tracking mechanism, in accordance with the present invention.

As seen in FIG. 2A, as a pictorial representation, radio-dial drive 20, for celestial tracking mechanism, includes a support structure 45 and a cylindrical drum 42, mounted on support structure 45, via a shaft and bearing, so that 42 can rotate relative to support structure 45. Drum 42 defines a drum axis of rotation 43, a drum external surface 41, along its circumference, and a drum flange surface 44. Additionally, drum 42 includes:

a central shaft 48, parallel to drum axis of rotation 43, and fixedly attached to drum 42, so as to rotate with drum 42, in axis of rotation 43;

a spring 52, mounted on drum external surface 41, having a spring axis 59, orthogonal to drum axis of rotation 43; and an anchor 54, mounted on drum external surface 41.

Additionally, radio-dial drive 20 includes a cylindrical capstan 50, mounted on support structure 45, adjacent to drum 42. Capstan 50 defines a capstan axis of rotation 47, parallel to drum axis of rotation 43, and a capstan external surface 49, along its circumference.

A cable 56, having first and second ends 51 and 53, respectively, is tightly wound around drum 42 in a first direction, and around capstan 50 in a second direction, wherein first end 51 is fixedly attached to spring 52 and second end 53 is fixed against drum external surface 41 by anchor 54.

Additionally, spring 52 is held in tension with a force which is just greater than the required force for turning drum 42 and shaft 48, so that turning the capstan 50 in a first direction will turn drum 42 in a second direction, with substantially zero backlash and substantially zero drift.

Substantially zero backlash relates to a near absence of slack in cable 56, as capstan 50 changes a direction of rotation, for example, from clockwise to counterclockwise, or vice versa.

Substantially zero drift relates to a near absence of slippage in cable 56 against drum external surface 41, and against the capstan surface 49.

The travel of drum 42 is described by an arrow 55 and is preferably ±90°, for an arc of 180°. It will be appreciated that other values which may be smaller or larger are also possible. Capstan 50, which is considerably smaller than drum 42, makes several revolutions, as illustrated by an arrow 57, as drum 42 completes an arc of 180°. The diametric ratios of drum 42 and capstan 50 may be, for example, 1 to 6.5. It will be appreciated that other values, which may be smaller or larger, are also possible.

A computer-controlled motor 40, or another computer controlled drive system provides the tuning or tracking motion to capstan 50, based on an expression for the 30 direction that will maximize the solar incident flux, as functions of date, time, and geographic location. Motor 40 may be a stepped motor or a DC motor. Additionally, a close-loop system, described hereinbelow, in conjunction with FIGS. 4A-4B and 5 may be used.

FIG. 2B provides another pictorial representation of radio-dial drive 20, showing drum 42, capstan 50, motor 40, and a shaft 48. Stops 46 may be used to control the travel range of drum 42, preferably to ±90°, as illustrated by arrow 55 (FIG. 2A).

In the embodiment of in FIGS. 2A-2B, the importance of radio-dial drive 20 is that it is a relatively inexpensive means for producing motion of low hysteresis, low backlash, and high rigidity.

Figure 3:
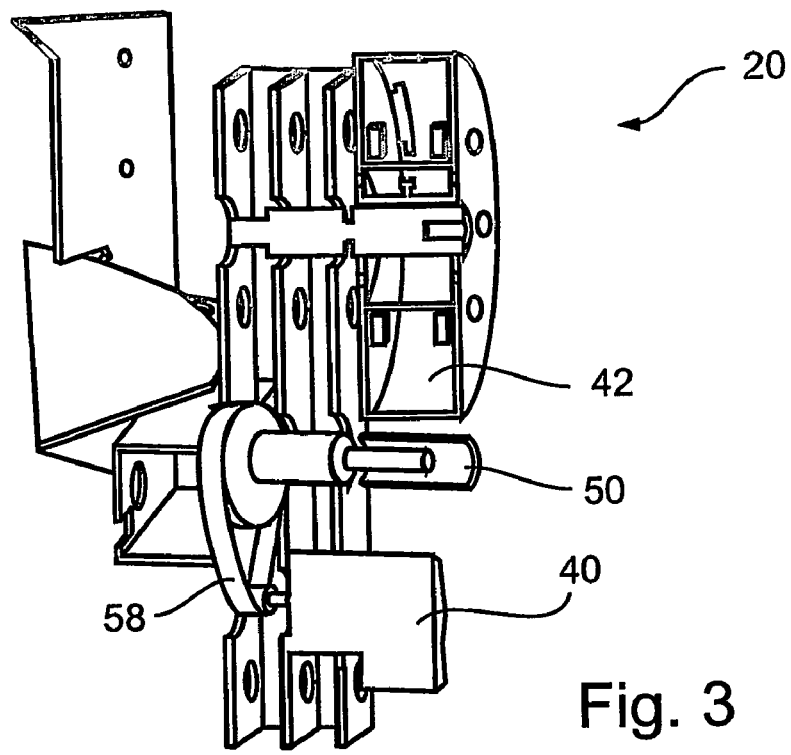
FIG. 3 schematically illustrates a cross-sectional view of a radio-dial drive, associated with a timing belt, in accordance with another embodiment of the present invention.

FIG. 3 schematically illustrates a side view of radio-dial drive 20, in accordance with another embodiment of the present invention, in which motor 40 drives a timing belt 58, which drives capstan 50, while motion from capstan 50 to drum 42 is transmitted via radio-dial drive 20, as in the previous embodiment.

In essence, when using radio-dial drive 20 to transmit the motion of belt 58 to drum 42, via capstan 50, errors due to hysteresis and backlash between motor 40 and capstan 50 is reduced by a factor equivalent to the diametric ratio of drum 42 to capstan 50, for example, about 6, when the motion is transmitted from capstan 50 to drum 42.

It will be further appreciated that in solar tracking, very small errors in motion can make a significant difference in solar incident flux, for example, a difference in a factor of about 250, between about 2 suns and about 500 suns. Ordinarily, the accuracy required for fine motion control of this type is very expensive. Yet the novel feature of the present invention is in the simple, inexpensive solution of the radio-dial mechanism for considerably increasing the accuracy of the tracking, hence the actual solar incident flux and the power generation.

It will be appreciated that other manners of driving capstan 50, including belts, timing belts, gears, and the like may be used.

Figure 4A:
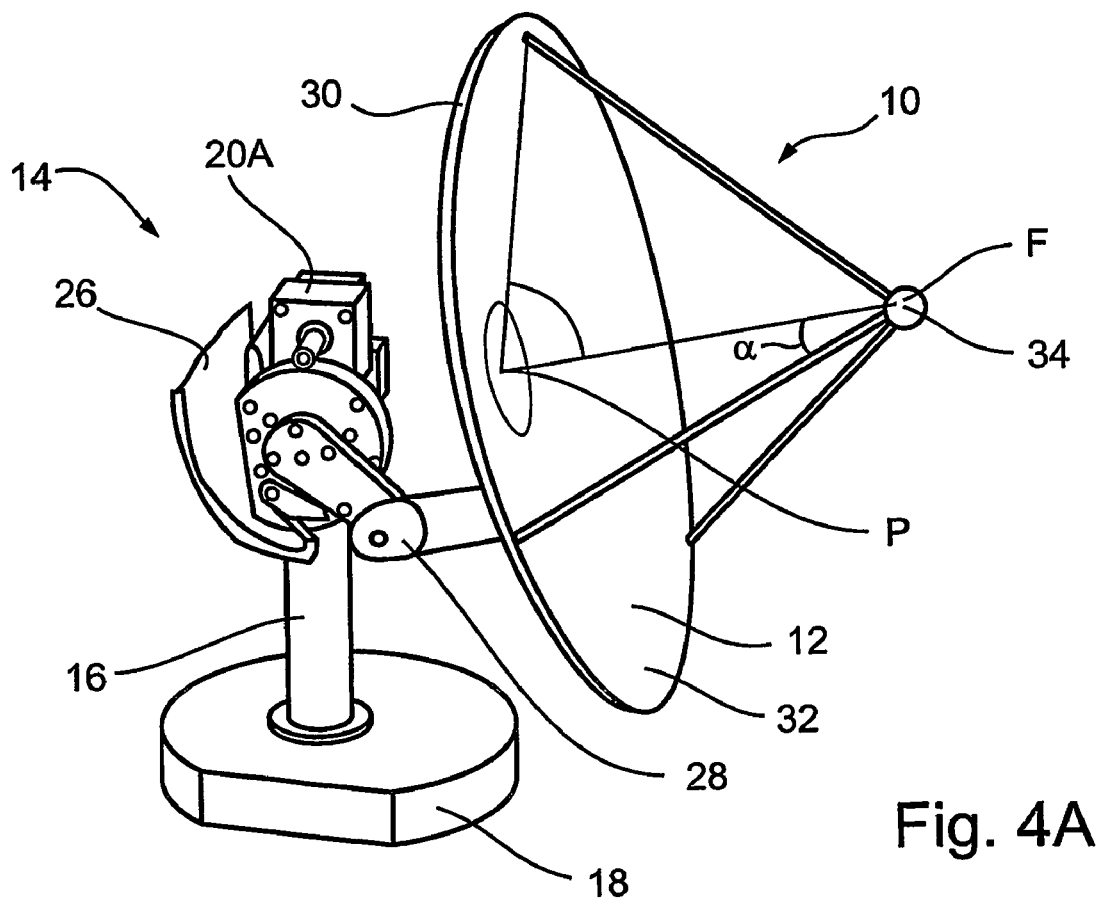
FIGS. 4A-4B schematically illustrate first and second views of a concentrating solar collector, operable with two-axis tracking, each having a radio-dial drive, in accordance with the present invention.
Figure 4B:
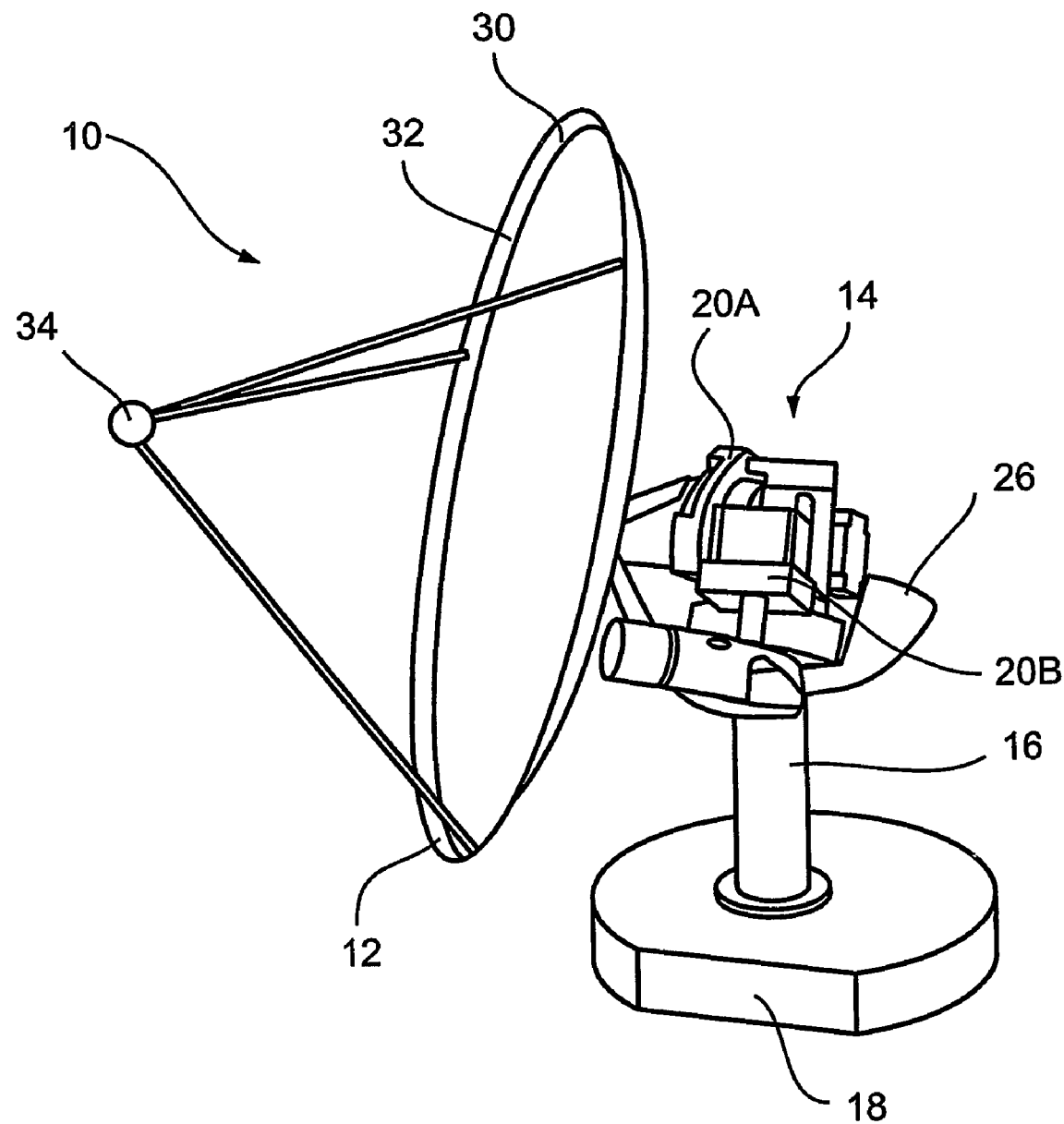

Referring further to the drawings, FIGS. 4A-4B schematically illustrate first and second views of a collector 10, preferably mounted on an cross-elevation mount 100B, and preferably incorporating two radio-dial drives, in accordance with the present invention.

Collector 10 preferably includes a concentrator 12, mounted on a drive unit 14. Drive unit 14 is mounted on a pedestal 16, having a base 18. Preferably, concentrator 12 is dish-like, having a focal point. Alternatively, other geometries, for example polygonal, preferably for two-dimensional concentration, so as to substantially focus the incident radiation to a focal point, may be used. Alternatively still, concentrator 12 may be trough-like.

Additionally, drive unit 14 includes at least a first drive module 20A (FIGS. 4A and 4B), for solar tracking along a first axis, and preferably also, a second drive module 20B (FIG. 4B), for solar tracking along a second axis, orthogonal to the first axis. Drive unit 14 further includes a counterweight 26.

Concentrating dish 12 preferably includes a rim 30. A reflector 32 forms the surface of concentrating dish 12, which faces the sun. The angle between rim 30, a focal point F of dish 12, and a center P is α, which may be used as a measure of the concentrating power of dish 12.

A power conversion unit 34, substantially at the focal point of concentrating dish 12, may be photovoltaic cells, adapted for concentrated radiation. Alternatively, a thermal engine or another known method of producing electric power may be used.

Drive unit 14 is mounted on pedestal 16, structured so that it can carry the loads of dish 12 and the drive unit 14, while allowing full motion of the drive modules 20A and 20B.

Dish 12 is attached to module 20B through a dish support 28.

Preferably, Collector 10 includes two degrees of motion.

When constructed as an azimuth-elevation mount or as a cross mount, these two motions simultaneously track the sun with respect to geographic, seasonal and daily variations.

Figure 5:
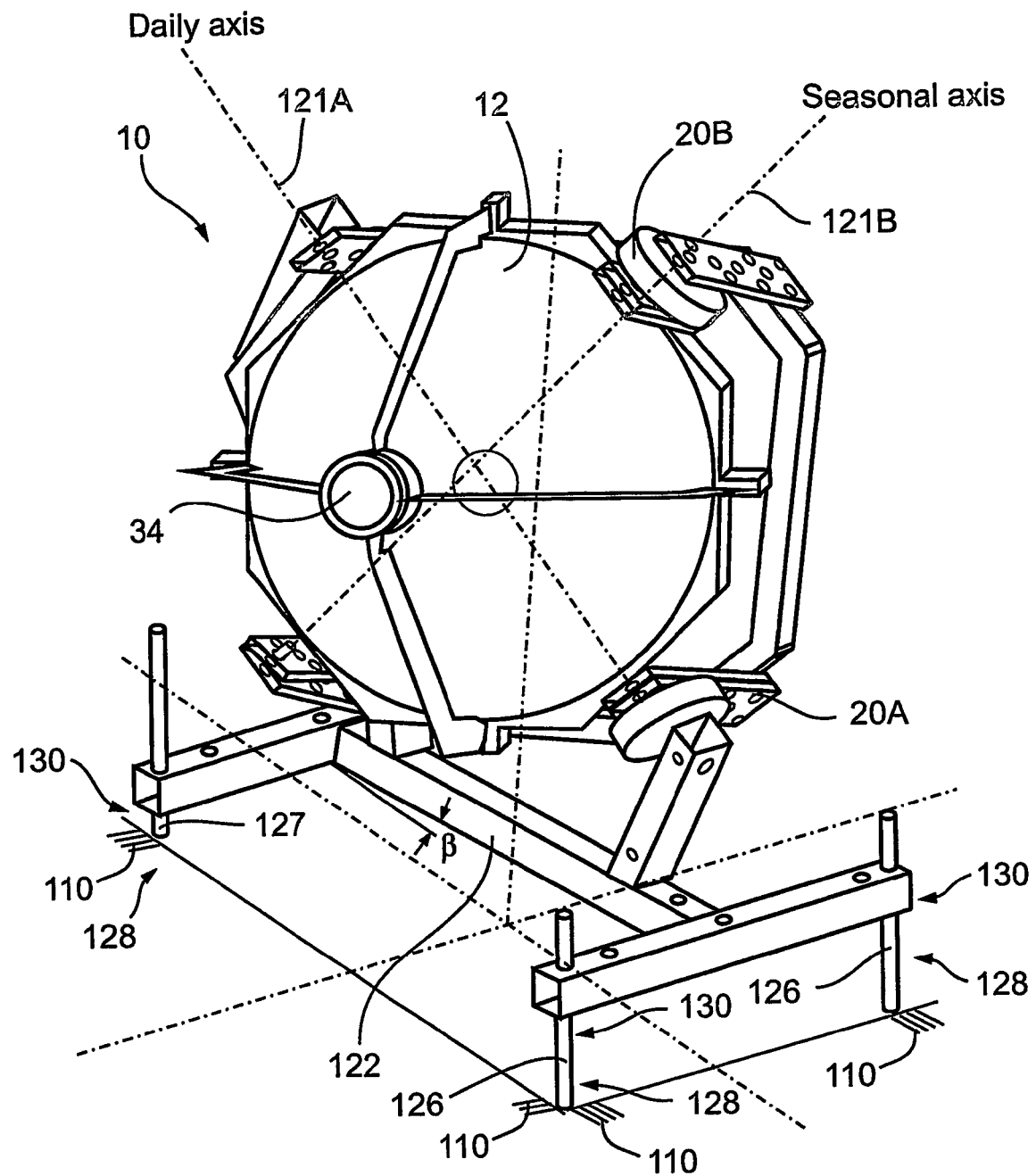
FIG. 5 schematically illustrates a concentrating solar collector, operable with two-axis tracking of a polar mount, each axis having a radio-dial drive, in accordance with another embodiment of the present invention.

Referring further to the drawings, FIG. 5 schematically illustrates collector 10, mounted on a polar mount 120, and preferably incorporating two radio-dial drives, in accordance with the present invention.

Accordingly, Collector 10 includes polar mount 120, having two poles 126 and two poles 127 (of which only one is seen in the pictorial representation), all having proximal ends 128, with respect to ground 110, and are fixed to ground 110 at their proximal ends 128. Poles 126 and 127 are connected by a rod 122, at their distal ends 130. Rod 122 makes angle β with the earth surface.

Polar mount 120 further includes daily axis of rotation 121A, for following the daily motion of the sun, from east to west.

Additionally, polar mount 120 includes seasonal axis of rotation 121B, for correcting the daily solar tracking for the seasonal changes, i.e., the tilt of the sun's daily trajectory in the sky, wherein the seasonal drive, around axis 121B is mounted on the daily drive around 121A.

The rotational motion of axis of rotation 121B is considerably slower than that of daily axis of rotation 121A. For example, axis of rotation 121B may be tuned intermittently, only once or twice daily, compared to the constant velocity of daily axis of rotation 121A.

In accordance with a preferred embodiment, as seen in FIG. 5, the structure is mechanically balanced such that the axes of rotation pass through the center of mass of the rotating frame. Therefore the loads on the motors and tracking mechanism are reduced.

It will be appreciated that other tracking mounts, as known, may similarly be used. For example, a tracking pedestal servo design as described in ViaSat Satellite Ground systems, downloaded on May 4, 2004 from: http://www.viasat.com/_files/__08fe203b613bc02b87de181a370e2bdf/pdf/Comparison%20of%20Pedestal%20Geometries.pdf may be used.

Alternatively, a single-axis tracking system, for daily tracking only, at some average seasonal or seasonal and geographic values, may be used.

In accordance with a preferred embodiment of the present invention, for example, as described in FIGS. 4A-4B and 5, a control unit, which includes an expression for the direction that will maximize the solar incident flux, drives motors 40 of units 20A and 20B and provides computer control of the tracking, as illustrated hereinbelow, in conjunction with FIG. 9.

In accordance with a preferred embodiment of the present invention, for example, as described in FIGS. 4A-4B and 5, unit 34 may further include differential means for measuring the solar incident flux, to provide a closed-loop control of the solar tracking. For example, where unit 34 is formed of concentrated photovoltaic cells, some cells may be operative as ¼ diodes, for measuring the solar incident flux on them, for providing the closed-loop control and correction of the tracking. Alternatively, other differential means may be used. The closed loop control is illustrated hereinbelow, in conjunction with collector 10A of FIG. 9.

The closed loop operation is another feature intended to increase the solar incident flux of the concentrating system. The tracking system may suffer from inaccuracies in motion and (or) from wind resistance that may divert its course, somewhat, so that reflector 12 may be actually pointing off from the orientation specified by the expression for the direction that will maximize the solar incident flux. The closed loop operation may then correct for the inaccuracy, by reporting to the computer that the solar incident flux is less than that which can be realized, leading the computer to specify a correction to the motion.

It is in this regard that the substantially zero backlash of radio-dial mechanism 20 is important. Backlash may occur with a change in the direction of motion, and generally, the basic tracking motion is unidirectional (except for seasonal changes in direction, twice a year, in the spring and fall). Thus the basic motion should not encounter backlash. However, the correction, as specified by the closed-loop system, may be in any of the two directions of motion of each axis, and must be highly accurate. Therefore, radio-dial mechanism 20, with its substantially zero backlash and substantially zero drift is particularly suitable for the correction motion, as specified by the closed loop system.

Preferably, the closed-loop system is additional to the system operated by the computer-calculated expression for the direction that will maximize the solar incident flux.

Alternatively, only a closed loop system, or only a computer-calculated expression for the direction that will maximize the solar incident flux may be employed.

Another aspect of the present invention relates to employing a Combined Heat and Power (CHP) circuit, for increased cost-effectiveness of the small-scale solar power system.

Figure 6:
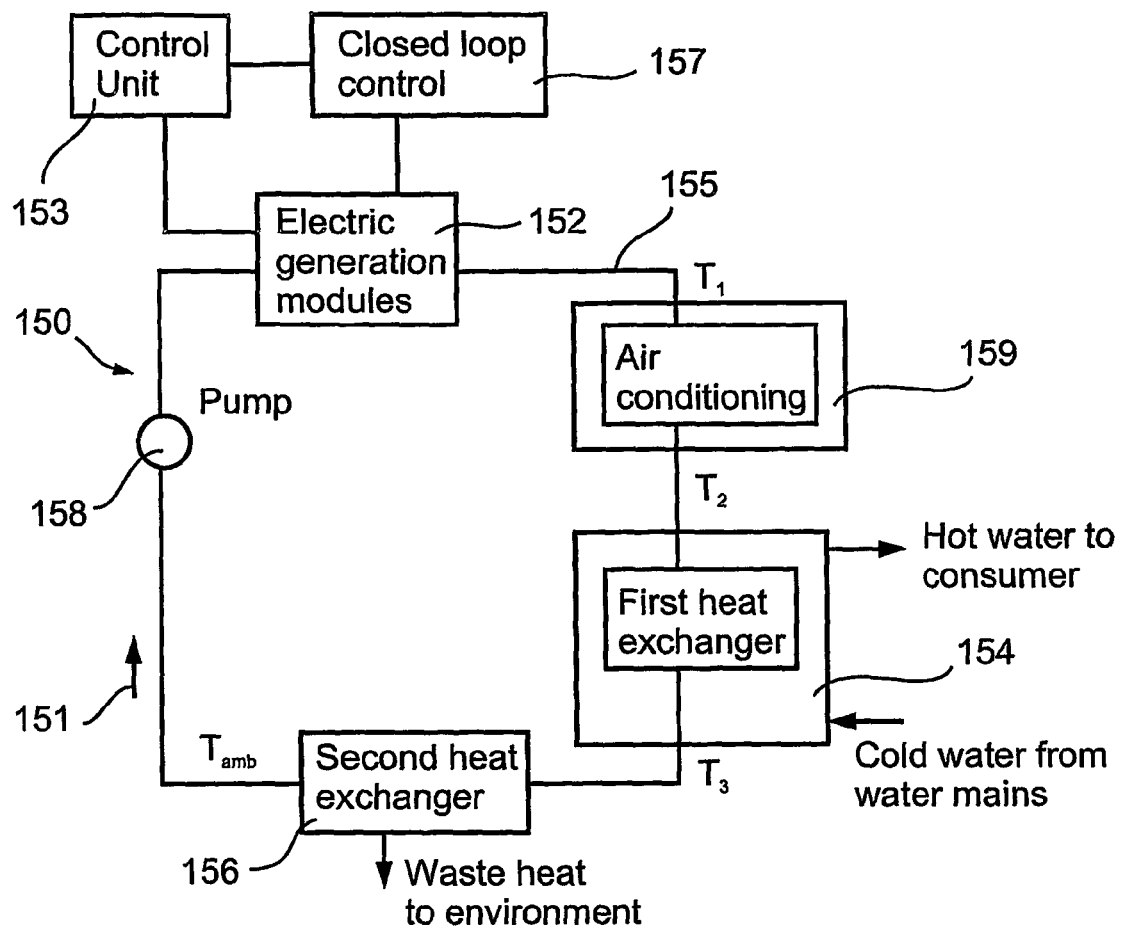
FIG. 6 schematically illustrates a schematic CHP circuit, in accordance with the present invention.

Thus, FIG. 6 schematically illustrates a CHP circuit 150, in accordance with the present invention.

Accordingly, CBP circuit 150 operates with a preferably closed-loop primary coolant circulating system 155, driven by a pump 158. The coolant may be water, oil, or another fluid, for example, a gas.

Thus, CHP circuit 150 includes a power generation module 152, which includes at least one Collector 10 (FIGS. 4A-4B and 5), having at least one power conversion unit 34, for example, a thermal engine or concentrated photovoltaic cells. A control system 153, preferably supported by a closed loop system 157 controls the tracking of at least one collector 10.

In essence, CBP circuit 150 may include three heat exchangers, each operating at a different temperature range.

An air-conditioning heat exchanger 159 between $T_1$ and $T_2$ may be used for air conditioning.

A main heat exchanger 154 between $T_2$ and $T_3$ may be used for producing hot water and for space heating.

An excess heat exchanger 156 between $T_3$ and $T_{ambient}$ may be used for discharging excess heat to the environment, when too much energy is produced, or when the energy produced is not used, for example, when the family is away.

It will be appreciated that the use of Collector 10 in conjunction with CHP circuit 150 greatly increases the overall efficiency and the economic viability of collector 10.

In accordance with a first embodiment, $T_1$ may be between 90 and 120° C. and $T_2$ may be between 60 and 80° C.

In accordance with a second embodiment, $T_1$ may be between 120 and 180° C. and $T_2$ may be between 80 and 120° C.

Figure 7:
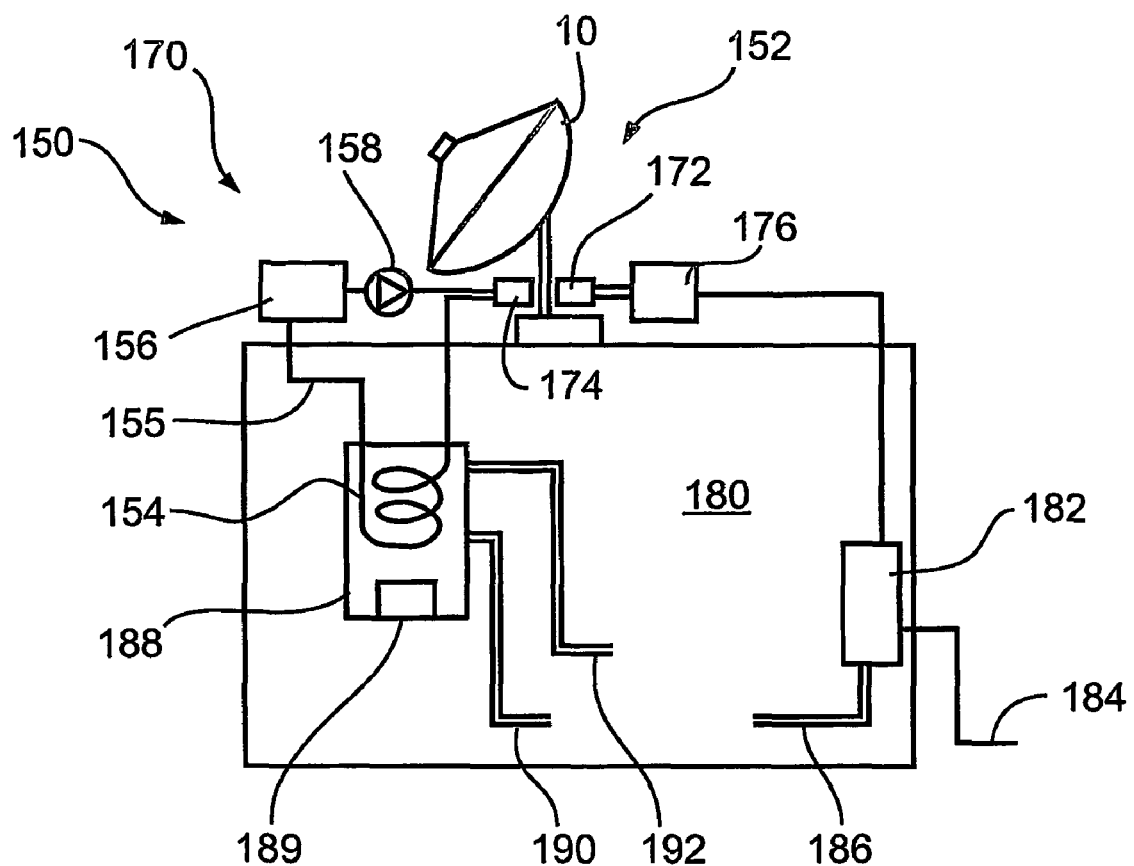
FIG. 7 schematically illustrates a single-solar-collector CHP circuit, in accordance with the present invention.

Referring further to the drawings, FIG. 7 schematically illustrates a single-solar-collector CHP circuit 170, in accordance with the present invention.

Solar concentrator unit 10 of circuit 170 includes two interfaces: an interface 172, for electrical connections, and an interface 174, for coolant connections. Preferably, electrical interface 172 connects to an inverter 176, which converts the DC electricity produced by power conversion unit 34 (FIGS. 4A-4B, and 5) to AC power and adjusts the frequency and phase to match that of the grid. The electric power from inverter 176 is connected to a main electrical box 182 and provides electrical power 186 to residential unit 180.

Preferably, residential unit 180 is also connected to a grid 184. When power generation is insufficient, backup power may be supplied by grid 184. Alternatively, when power generation exceeds that which is consumed, the excess can flow to grid 184, provided the power distributor allows and supports two-directional power flow, and the power meter is adapted for it.

In the absence of air conditioning, coolant flows from interface 174 to main heat exchanger 154 (as in FIG. 6), and is operative to heat hot-water tank 188 of residential unit 180. It will be appreciated that hot-water tank 188 may also contain a backup heater 189, as known. Hot water from hot-water tank 188 may supply general hot water needs 190 of residential unit 180, as well as space heating 192, for example, through radiators, or under-floor water pipes.

As has been illustrated in conjunction with FIG. 6, the coolant of the primary loop of CHP circuit 150 flows to excess heat exchanger 156, where excess heat is removed. Pump 158 ensures circulation.

Figure 8:
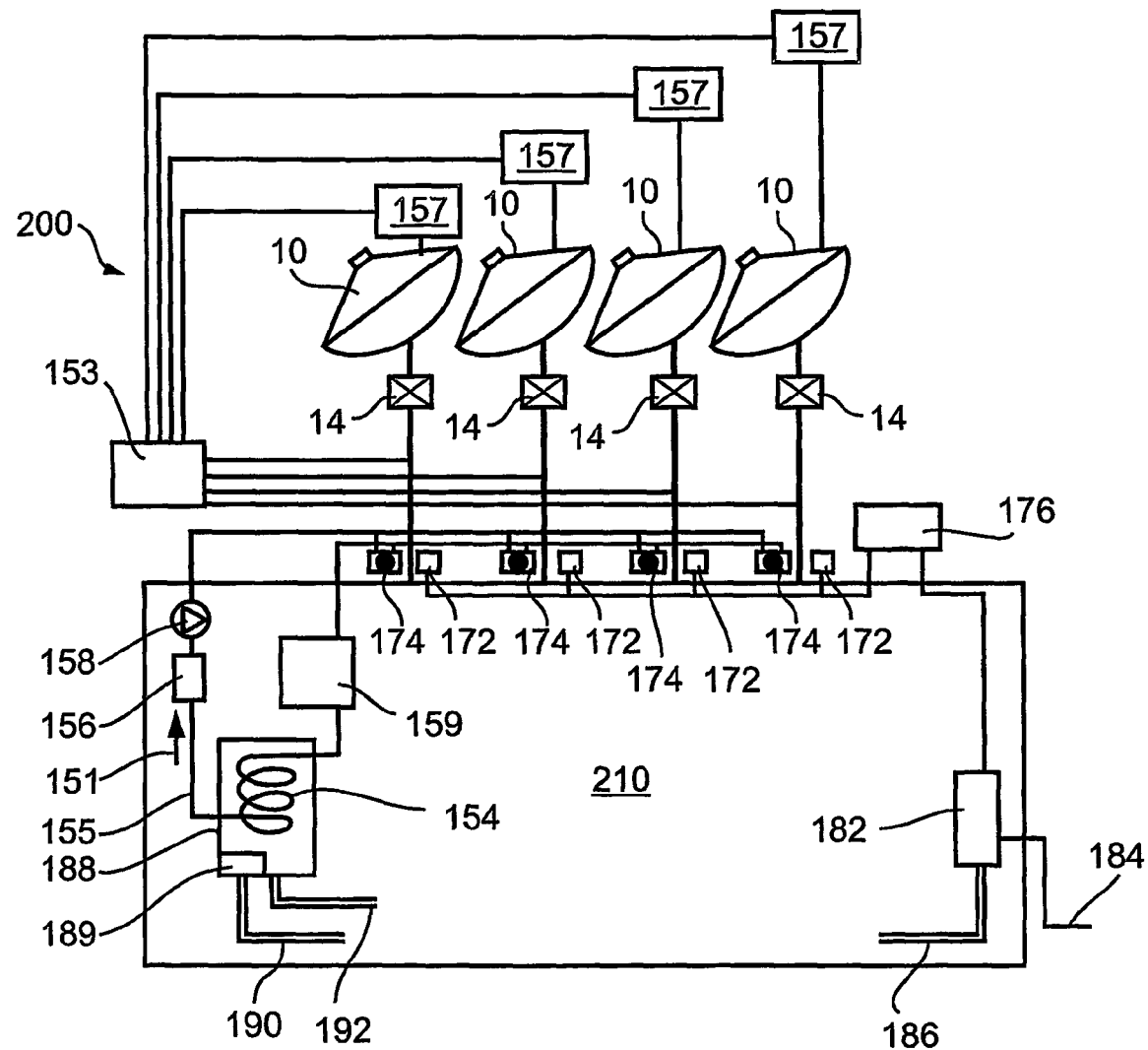
FIG. 8 schematically illustrates a CHP circuit for a cluster of solar collectors, in accordance with the present invention.

Referring further to the drawings, FIG. 8 schematically illustrates a CHP circuit 200 for a cluster of solar collectors, for residential or small commercial unit 210, in accordance with the present invention.

The advantage of using a cluster of concentrating solar collectors 10, is that power collection is greatly increased, while the number of auxiliary components, such as secondary heat exchanger 156 and pump 158, and control unit 153 remains the same, so as to further improve the cost effectiveness and economic viability of the system. Additionally, maintenance could be simplified for a single component replacing many identical smaller components.

The operation of cluster 200 is similar to the operation of system 170 (FIG. 7), with the following exceptions:
1. Electrical interfaces 172 of each concentrating solar collectors 10 may be connected in series or in parallel, or in a combination of series and parallel connections, providing flexibility in power and voltage input to a residential unit 210.
2. At the same time, the control of all concentrating solar collectors 10 may be performed by control unit 153 (FIG. 6), since the tracking data for all concentrating solar collectors 10 is the same.
3. The hot water interfaces from all collectors may be connected to a single secondary closed loop system. The connection is in parallel. The pipe leads to a central primary heat exchanger in the hot water tank, a central secondary heat exchanger, and a single pump. Since the plurality of collectors are connected in parallel, each collector receives the same low inlet temperature and the total flow rate in the pump and in the main pipe is the sum of flow rates in all the collectors.
4. Although the number of collectors connected in parallel to a single pump and heat exchanger is not limited in principle, it may be reasonable to divide a large field into several independent sections, to limit the cost of the tubes.
5. The collector's cooling system is preferably a closed loop system, separate from the water going to the consumer's hot water outlets. This prevents dirt, corrosion and freezing of water in the collector. The water in the closed loop system can be treated with antifreeze, corrosion suppressor, etc. without affecting the water quality to the consumer.

Typical applications for a cluster of concentrating solar collectors 10 are:
1. A single home, if it is desirable to replace a large fraction of the energy consumption by solar energy
2. A multi-family house that provides a central supply of electricity, hot water, space heating etc. to individual family units
3. A shopping mall with a large flat roof that is not used for other applications, the collector cluster can provide electricity; space heating by a network of hot water supplied to water-to-air heat exchangers; hot water to sinks in restaurant kitchens; hot water to restrooms for sinks and showers; air conditioning by supplying hot water to absorption chillers.
4. Other large buildings: an office building, industrial building, school, health clinic: similar to a mall, with a different mix of energy needs.

Figure 9:
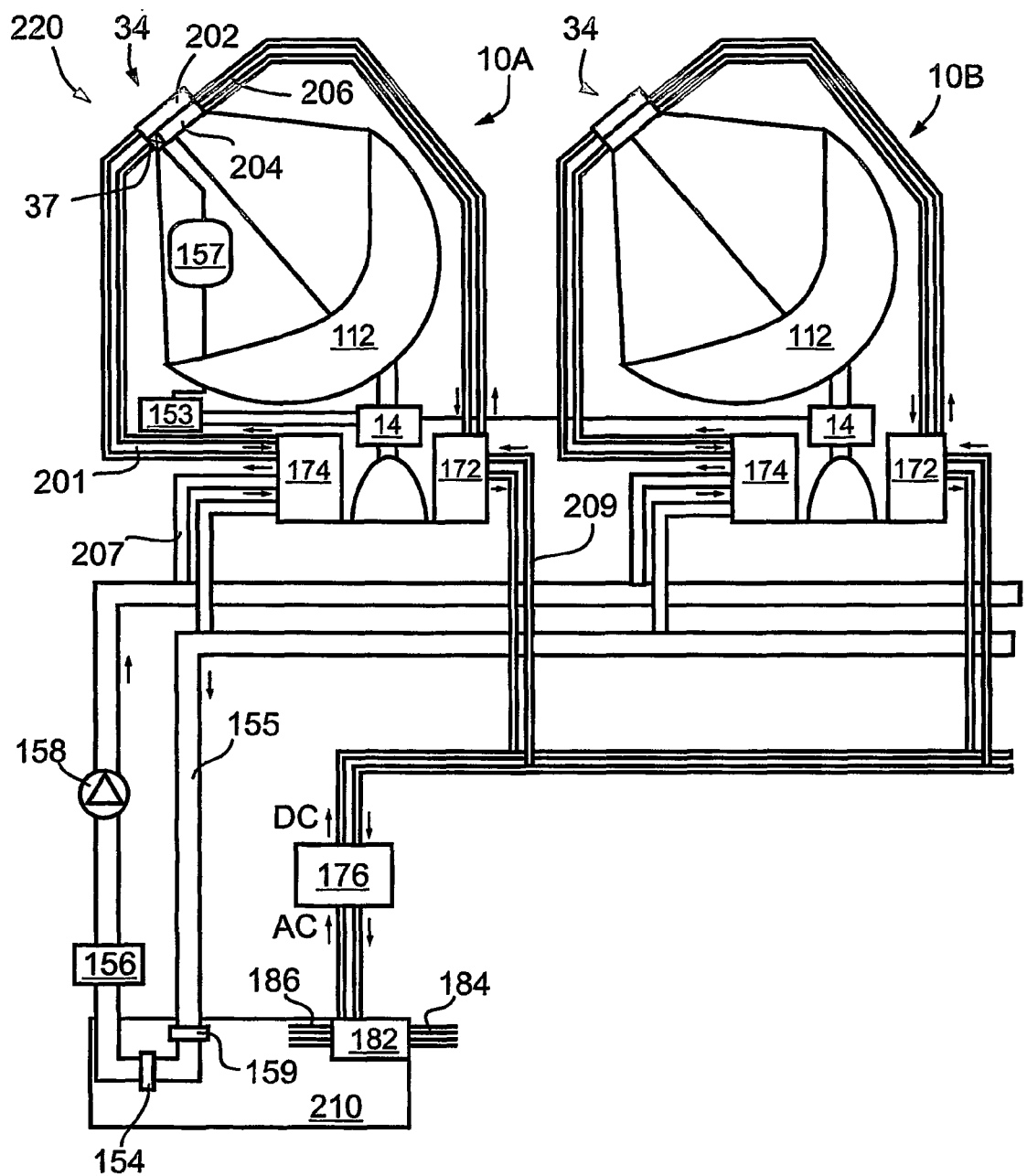
FIG. 9 schematically illustrates the cluster arrangement of FIG. 8, in accordance with the present invention.

Referring further to the drawings, FIG. 9 schematically illustrates a cluster arrangement 220, in detail.

Accordingly, each power conversion unit 34 may include a photovoltaic cell portion 204 and a cooling portion 202. Photovoltaic cell portion 204 connects by a power line 206 to interface 172, and a power line 209 connects each interface 172 to inverter 176, where DC power is converted to AC power. From inverter 176, power is directed to main electrical box 182.

Cooling portion 202 connects by coolant lines 201 to interface 174. Wherefrom, coolant flows in lines 207 to primary coolant system 155.

For illustrative purposes, cluster arrangement 220 includes a closed loop operating collector 10A, operating with control unit 153 for driving drive 14, with input from closed loop system 157. Differential diodes 37 provide the flux measurements for the closed loop operation.

Additionally, cluster arrangement 220 includes an open loop collector 10B, which receives input from control unit 153, only.

It will be appreciated that in general, the cluster arrangement may be either closed loop or open loop. In general, a single control unit 153 may be used will all the collectors, but each may require its individual closed loop system 157.

The following are general design parameters for the present invention.

A typical size for a solar energy system of the present invention, as illustrated in FIGS. 4A-4B and 5 may be a concentrator diameter of between about 0.5 meters and about 2 meter, and preferably, about 1 meter, capable of producing about 150 Watts of electricity, together with about 350 Watts of heat. Thus, the structural support of the collector needs be relatively light, since the wind loads are relatively small. The tracking mechanism is relatively simple and can be manufactured relatively inexpensively.

The cost of manufacturing such a system is estimated at about $2 per Watt at peak power. The required investment for a suitable production line is estimated at about $5M. Given an annual production rate of 5 Megawatts and an interest rate of 5%, the surcharge for repaying the initial investment is estimated at only about $0.13 per Watt at peak power. Therefore the required market volume for the proposed small-scale system is smaller by an order of magnitude than that of current, large systems, and the required investment risk is correspondingly smaller.

The small-scale solar energy systems can be installed at the point of consumption, such as on rooftops of domestic and public buildings, in urban environment, supplying them with both power and hot water, for domestic water and space heating. With a Combined Heat and Power (CHP) system an overall efficiency of the system may be competitive with fossil fuel power plants.

Cost estimates are based on an annual production rate of 250,000 m², which corresponds to 1.2 million and 260,000 units per year for concentrators of between about 0.5 m and 1.1 m in diameter. The production period, i.e., the period during which the system may be produced and sold, and the initial investment can be amortized and recovered is about 10 years.

Design parameters, considerations, and requirements for Collector 10 of FIGS. 4A-4B and 5 are discussed below:

1. Reflector 12 may be designed as a concave parabolic dish with a projected (aperture) diameter of about between 0.5 and 2 meters, and preferably about 1.1 meter in diameter. It will be appreciated that other diameters are also possible.
2. Angle α of concentrating dish 12 (FIG. 4A), is preferably about 45°. It will be appreciated that other angles, for example, 40° or 55° may be used. In particular, for heliostats, smaller angles are generally employed.
3. Drive unit 14 preferably includes two drive modules, 20A and 20B.
4. The range of motion of the concentrating dish 12 is preferably a full hemisphere, to adapt to any type of tracking-axis configuration.
5. Preferably, power conversion takes place by high-efficiency photovoltaic cells, especially suited for concentrated energy conversion of several hundred suns, for example, "Triple-Junction Terrestrial Concentrator Solar Cells of Spectrolab Inc., 12500 Gladstone Av. Sylmar, Calif. 91342, USA, which operate at a power conversion efficiency of about 37%.

In accordance with the preferred embodiment of the present invention, CHP circuits 170 (FIG. 7) and CHP circuits 200 (FIG. 8) are of very high efficiency. For example, about 17% of collected energy may be converted to power, and 43% may be converted to usable heat, for an overall CHP efficiency of about 60%, and possibly even higher, for example, between 65 and 80%. Several factors, contribute to the unusually high efficiency, as follows:

1. A design for high concentration of several hundred suns;
2. The use of high-efficiency photovoltaic cells, for example, of for example, "Triple-Junction Terrestrial Concentrator Solar Cells of Spectrolab Inc., 12500 Gladstone Av. Sylmar, Calif. 91342, USA;
3. Power production at the point of consumption so as to eliminate power transmission losses;
4. Heat production at the point of consumption so as to eliminate heat transmission losses;

When applied together, these arrive at CHP overall efficiencies that have not be herethereto realized.

It is noteworthy to compare prior art large concentrating solar power systems with the small-scale CHP concentrating systems of the present invention.

1. For large concentrating solar power systems, wind resistance is high, creating high forces on the collector, and these may lead to structural deformation and may interfere with the accuracy of the tracking. In consequence, the support structure and tracking mechanism must be massive and quite expensive. By comparison, for small-scale systems, the problem of wind resistance is far less acute:
2. With an efficiency of power conversion to photovoltaic cells in the range of 10 to about 37 percent, most of the solar energy is discharged as heat. Yet in a centralized, remote area there is little opportunity to utilize that heat, for example, in a Combined Power and Heat (CPH) system, thus the heat is wasted. By comparison, small-scale systems, built on rooftops, may be designed as Combined Power and Heat (CPH), with a considerably increase in overall efficiency.
3. The large concentrating solar power systems are installed away from the consumer. Therefore additional costs due to power distribution and to transmission losses are incurred, reducing the amount of available electricity by 10-20%, and raising the cost of the electric power thus produced by factors of between 2 and 3. Yet with large concentrating systems of photovoltaic cells, transmission and distribution costs cannot be avoided since the systems are too large to be installed at the points of consumption. By comparison, for small-scale systems, built on rooftops, at the point of consumption, there are not distribution costs and no transmission losses to speak of.
4. The initial investment for large concentrating solar power systems is very high, making decisions in this regard difficult, bureaucratic, and risky. By comparison, for small-scale systems, the decision is of the individual homeowner, and governmental incentives may be used to make it less risky.
5. Furthermore, competitive costs may be realized for large concentrating solar power systems if a significant number of them, equivalent for example, to at least 50 megawatt per year, is manufactured. Yet such a market volume is difficult to guarantee; therefore, the investment and the risk associated with the development of such large systems are very high. By comparison, for small-scale systems, given governmental incentives, such a market may be realized.
6. Large concentrating solar power systems must be installed by trained personnel with specialized equipment and facilities, requiring special contractors, and special licenses, which increase their costs. By comparison, small-scale systems, may be installed with less-skilled personnel and less regulatory intervention.
7. Large concentrating solar power systems would generally require environmental studies and permits, so as to further increase their costs. By comparison, small-scale systems are unlikely to require environmental studies and permits.

8. Centralized power plants in general are vulnerable to malfunction and sabotage. A single incident of this nature can disrupt power supply for a very large segment of the population. By comparison, small-scale systems affect only an individual residence or business, and are generally connected to the grid, as a backup system.

It will be appreciated that a heat only system or a power only system may also be employed.

It will be appreciated that the solar tracking system in accordance with the present invention may be used in conjunction with a concentrating dish, a cluster of concentrating dishes, a heliostat, a cluster of heliostats, and an array of photovoltaic cells. Additionally, it may be used with other celestial tracking systems, for example, a telescope.

Additionally, a plurality of solar concentrating heliostats, mounted on solar tracking systems, preferably of two axes, may be used, forming a central receiver plant. The solar concentrating heliostats do not have individual power conversion units. Instead, a central receiver power conversion unit, located at a focal point of the plurality of heliostats, is used. Alternatively, photovoltaic arrays without concentration may be mounted on a solar tracking system of the present invention, of one or of two axes.

It is expected that during the life of this patent many relevant of the small-scale solar power systems and associated cost-effective tracking systems will be developed and the scope of the terms of the small-scale solar power systems and associated cost-effective tracking systems are intended to include all such new technologies a priori.

As used herein the term "about" refers to ±20%.

Additional objects, advantages, and novel features of the present invention win become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

It is appreciated that certain features of the invention, which are, for clarity, s described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed:

1. A solar power system comprising:
    at least one device, each said device including a single solar radiation concentrator having an aperture of between about 0.5 m and about 2 meters, adapted for focusing incident solar radiation, said solar radiation concentrator configured to achieve at least 200 suns concentrating ratio;
    at least one power conversion unit which receives said light after being focused; and
    at least one solar tracking apparatus comprising at least one rotational drive.

2. The system according to claim 1, wherein the system is configured for generating electric power and heat.

3. The system according to claim 1, wherein the system is configured for generating electric power.

4. The system according to claim 1, wherein the system is configured for generating heat.

5. The system according to claim 1, wherein said solar radiation concentrator is shaped as a concave parabolic dish with diameter of about 1.1 meters.

6. The system according to claim 1, wherein the solar radiation concentrator is shaped as a dish or a polygon.

7. The system according to claim 1, wherein said at least one rotational drive comprises a radio-dial type drive.

8. The system according to claim 7, wherein said radio-dial type drive is configured to have substantially zero backlash.

9. The system according to claim 7, wherein said radio-dial type drive is configured to have substantially zero drift.

10. The system according to claim 7, wherein said radio-dial type drive comprises a cable wrapped about a rotational element under a tension sufficient to have substantially zero backlash and substantially zero drift to avoid slack and slippage between the cable and the rotational element.

11. The system according to claim 1, wherein the tracking apparatus comprises two rotational drives rotating around two non-parallel rotation axes.

12. The system according to claim 1, further comprising a controller configured to maximize the radiation flux on the power conversion unit, using at least one of (a) a calculated expression based on geographical and time data, (b) a closed loop correction based on a measurement of at least one of the radiation flux or the generated output power.

13. The system according to claim 1 wherein the solar radiation concentrator is configured to concentrate to at least about 800 suns.

14. The system according to claim 1, wherein the power conversion unit comprises at least one of a thermal engine and one or more concentrated photovoltaic cell.

15. The system according to claim 2, characterized by a combined conversion efficiency to heat and electricity of at least 60%.

16. The system according to claim 15, wherein the combined conversion efficiency is about 80%.

17. The system according to claim 1, further comprising a coolant fluid mechanism adapted to heat the coolant fluid to at least 120° C. by absorbing heat from the power conversion unit.

18. The system according to claim 17, wherein the coolant fluid mechanism is adapted to heat the coolant fluid to at least 180° C.

19. The system according to claim 1, wherein said at least one device and said at least one power conversion unit comprise a plurality of solar radiation concentrators and a plurality of power conversion units configured to be installed on a single said solar tracking apparatus.

20. A solar plant comprising one or more solar collectors, wherein at least one of said solar collectors comprises:
    at least one device, each said device including a single solar radiation concentrator having a diameter smaller than about 2 meters with at least 200 suns concentration, adapted for focusing incident solar radiation;

at least one power conversion unit which receives said light after being focused; and a solar tracking apparatus comprising at least one rotational drive.

21. A solar plant according to claim 20, wherein said one or more collectors comprises a plurality of collectors which share a fluid pathway.

22. The solar plant according to claim 20, further comprising a controller, which controls at least one solar tracking apparatus.

23. The solar plant according to claim 21, wherein said one or more solar collectors further comprising a coolant fluid mechanism, and wherein said fluid pathway comprises a common closed loop coolant system.

24. The solar plant according to claim 23, wherein said closed-loop coolant system comprises at least one heat exchanger.

25. A method for supplying energy, the method comprising:

providing at least one device, each said device including a single solar collector, comprising:

a single solar radiation concentrator having a diameter smaller than about 2 meters, adapted for focusing incident solar radiation;

at least one power conversion unit which receives said light after being focused; and a solar tracking apparatus comprising at least one rotational drive; and supplying at least one of a hot fluid and electric power to one or both of at least one appliance, and at least one power grid or both, using the at least one device.

26. The method according to claim 25, wherein the at least one appliance comprises a space heater comprising a heat exchanger.

27. The method according to claim 25, wherein the at least one appliance comprises an air conditioner comprising at least one absorption chiller.

28. The method according to claim 25, wherein the at least one appliance comprises a hot water supply comprising a heat exchanger.

29. The method according to claim 25, wherein the at least one appliance comprises a plurality of appliances, and wherein the supplying of the hot fluid comprises supplying the hot fluid at substantially different temperatures to each of at least two of the plurality of appliances.

30. The method according to claim 25, further comprising discarding excess heat.

31. The method according to claim 25, further comprising transmitting electric power to an electric grid.

32. The system according to claim 1, wherein each said concentrator has a single focal point.

33. The system according to claim 32, wherein each of said at least one power conversion unit is positioned substantially at said focal point.

34. The system according to claim 33, wherein each said concentrator has a dish-like configuration.

35. The system according to claim 33, wherein each said concentrator has a polygonal configuration.

36. The system according to claim 1, wherein each said concentrator has a focal line.

37. The system according to claim 36, wherein each said concentrator has a trough-like configuration.

38. The solar plant according to claim 20, wherein each said solar radiation concentrator has up to 800 suns concentration.

* * * * *